United States Patent
Wu et al.

(10) Patent No.: US 9,842,844 B2
(45) Date of Patent: Dec. 12, 2017

(54) CONTACT STRAP FOR MEMORY ARRAY

(71) Applicant: GLOBALFOUNDRIES Singapore Pte. Ltd., Singapore (SG)

(72) Inventors: Ling Wu, Singapore (SG); Jianbo Yang, Singapore (SG); Kian Hong Lim, Singapore (SG); Sung Mun Jung, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 41 days.

(21) Appl. No.: 14/491,981

(22) Filed: Sep. 20, 2014

(65) Prior Publication Data

US 2015/0087123 A1    Mar. 26, 2015

Related U.S. Application Data

(60) Provisional application No. 61/880,187, filed on Sep. 20, 2013.

(51) Int. Cl.

| | |
|---|---|
| *H01L 27/112* | (2006.01) |
| *H01L 27/115* | (2017.01) |
| *H01L 29/788* | (2006.01) |
| *H01L 21/28* | (2006.01) |
| *H01L 27/11521* | (2017.01) |
| *H01L 29/06* | (2006.01) |
| *H01L 27/11548* | (2017.01) |
| *H01L 21/768* | (2006.01) |
| *H01L 29/423* | (2006.01) |
| *H01L 27/11526* | (2017.01) |

(52) U.S. Cl.
CPC .. *H01L 27/11521* (2013.01); *H01L 21/28273* (2013.01); *H01L 21/76802* (2013.01); *H01L 27/11526* (2013.01); *H01L 27/11548* (2013.01); *H01L 29/0619* (2013.01); *H01L 29/42324* (2013.01); *H01L 29/42328* (2013.01); *H01L 29/788* (2013.01)

(58) Field of Classification Search
CPC ......... H01L 29/42328; H01L 29/42344; H01L 29/788; H01L 27/11521; H01L 21/28273; H01L 27/11548; H01L 27/11524; H01L 27/11529; G11C 16/0483; G11C 16/14

See application file for complete search history.

(56) References Cited

U.S. PATENT DOCUMENTS

| | | | |
|---|---|---|---|
| 2006/0028868 A1* | 2/2006 | Okazaki ............. | G11C 16/0425 365/185.05 |
| 2011/0141806 A1* | 6/2011 | Kim .................... | G11C 16/0441 365/185.2 |

(Continued)

*Primary Examiner* — Thanhha Pham
(74) *Attorney, Agent, or Firm* — Horizon IP PTE Ltd.

(57) ABSTRACT

Devices and methods for forming a device are disclosed. The method includes providing a substrate having a memory array region. Front end of line (FEOL) process is performed to form components of memory cell pairs. The FEOL process forms storage gates, access gates or word lines, source/drain regions, spacers, erase gates and source line isolation dielectrics. The memory cell pair shares a common source line (SL). A SL strap opening is provided. The source line strap opening is formed between adjacent memory cell pair. The source line strap opening does not overlap the storage gate of the memory cell.

20 Claims, 9 Drawing Sheets

(56) References Cited

U.S. PATENT DOCUMENTS

| | | | |
|---|---|---|---|
| 2014/0264534 A1* | 9/2014 | Tsair | H01L 29/66825 257/316 |
| 2015/0021679 A1* | 1/2015 | Tsair | H01L 29/788 257/320 |

* cited by examiner

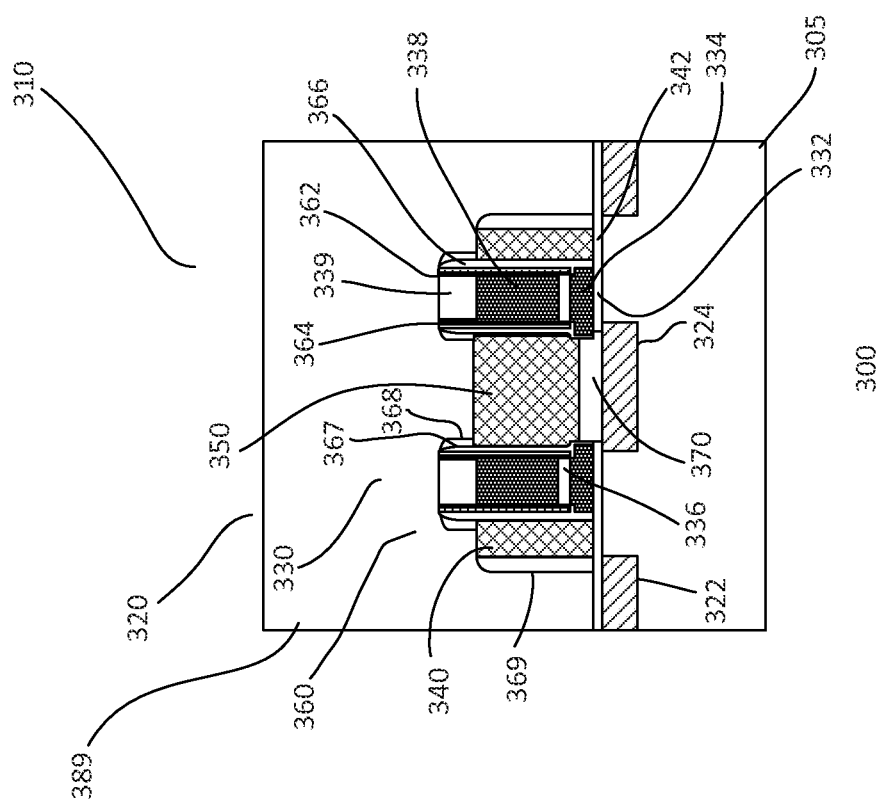

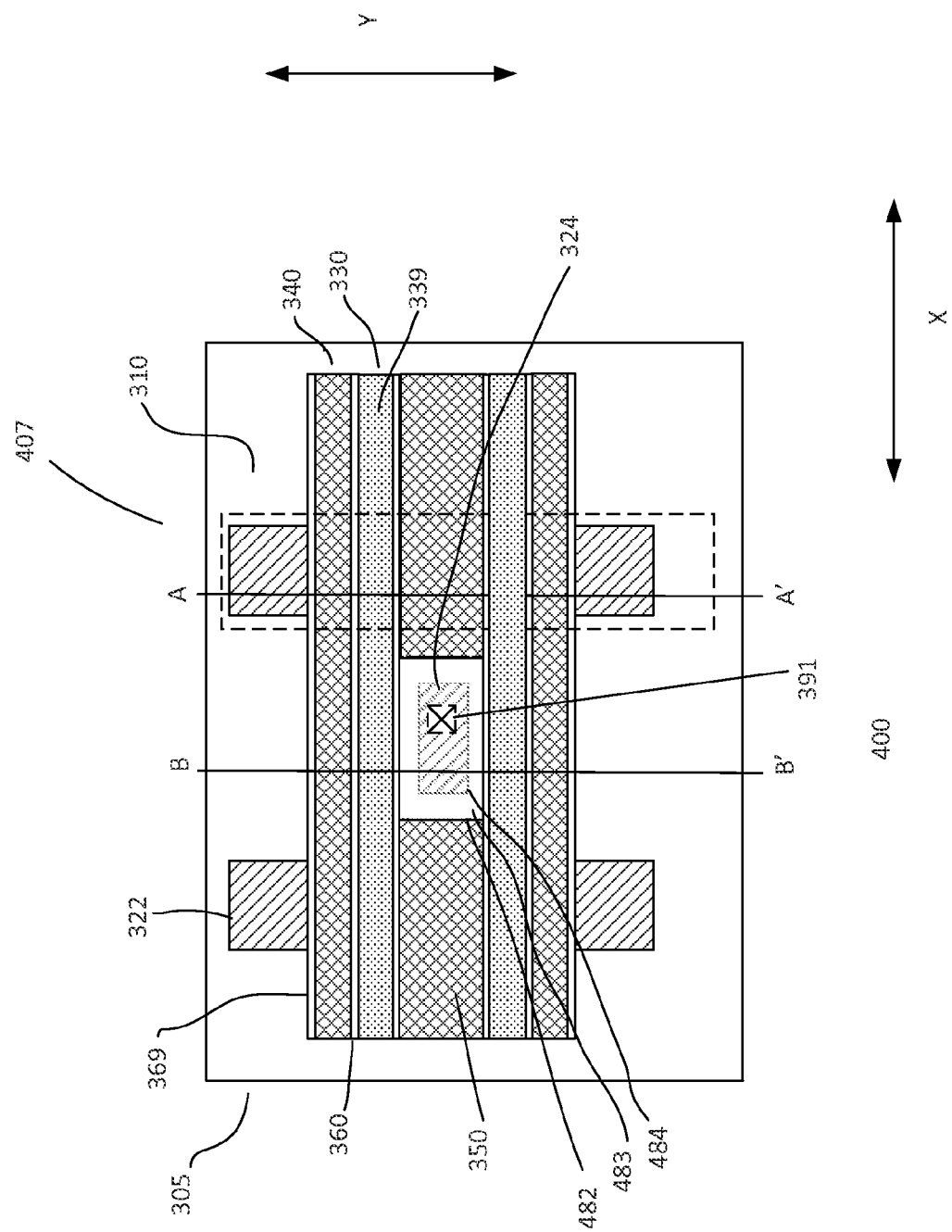

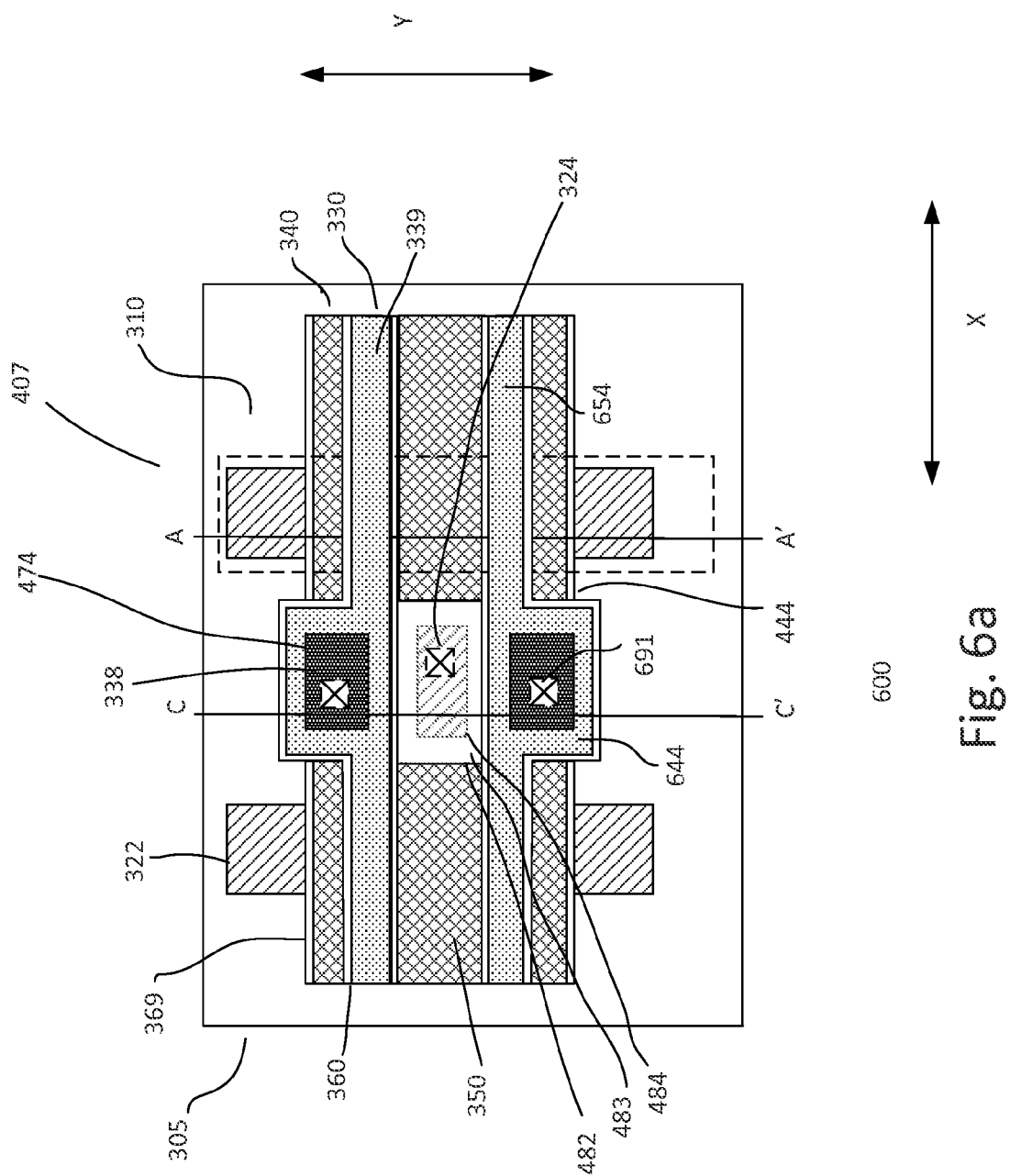

CONTACT STRAP FOR MEMORY ARRAY

CROSS-REFERENCE TO RELATED APPLICATION

This application claims the priority benefit of U.S. Provisional Application Ser. No. 61/880,187, filed on Sep. 20, 2013, which is herein incorporated by reference in its entirety.

BACKGROUND

Nonvolatile memory (NVM) devices are able to retain stored data even when the power supply is interrupted. Non-volatile memory devices include flash devices which can be programmed using electrical signals. A NVM device, for example, includes a memory transistor and a select or access transistor in series. The memory transistor stores data programmed into the memory cell, while the access transistor selects the memory cell to be programmed or erased.

The memory transistor can be of various types. For example, the memory transistor may have a stacked gate structure having a control gate over a floating gate and a storage layer sandwiched between control and floating gates. During fabrication of the memory devices, we have observed that erosion of control gate occurs during processing, resulting in potential defects which cause reliability and yield issues.

The present disclosure is directed to a memory cell with improved reliability and the method of forming thereof.

SUMMARY

Embodiments generally relate to semiconductor device and method for forming a semiconductor device. In one embodiment, a method for forming a device is presented. The method includes providing a substrate having a memory array region. Front end of line (FEOL) process is performed to form components of memory cell pairs. The FEOL process forms storage gates, access gates or word lines, source/drain regions, spacers, erase gates and source line isolation dielectrics. The memory cell pair shares a common source line (SL). A SL strap opening is provided. The source line strap opening is formed between adjacent memory cell pair. The source line strap opening does not overlap the storage gate of the memory cell.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following:

FIG. 3 shows a cross-sectional view of an embodiment of a device; and

FIG. 4a shows a top view of an embodiment of a layout of the device and FIGS. 4b-4c show cross-sectional views at A-A' and B-B';

FIG. 6a shows yet a top view of another embodiment of a layout of the device and FIG. 6b shows cross-sectional view at C-C'.

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1:
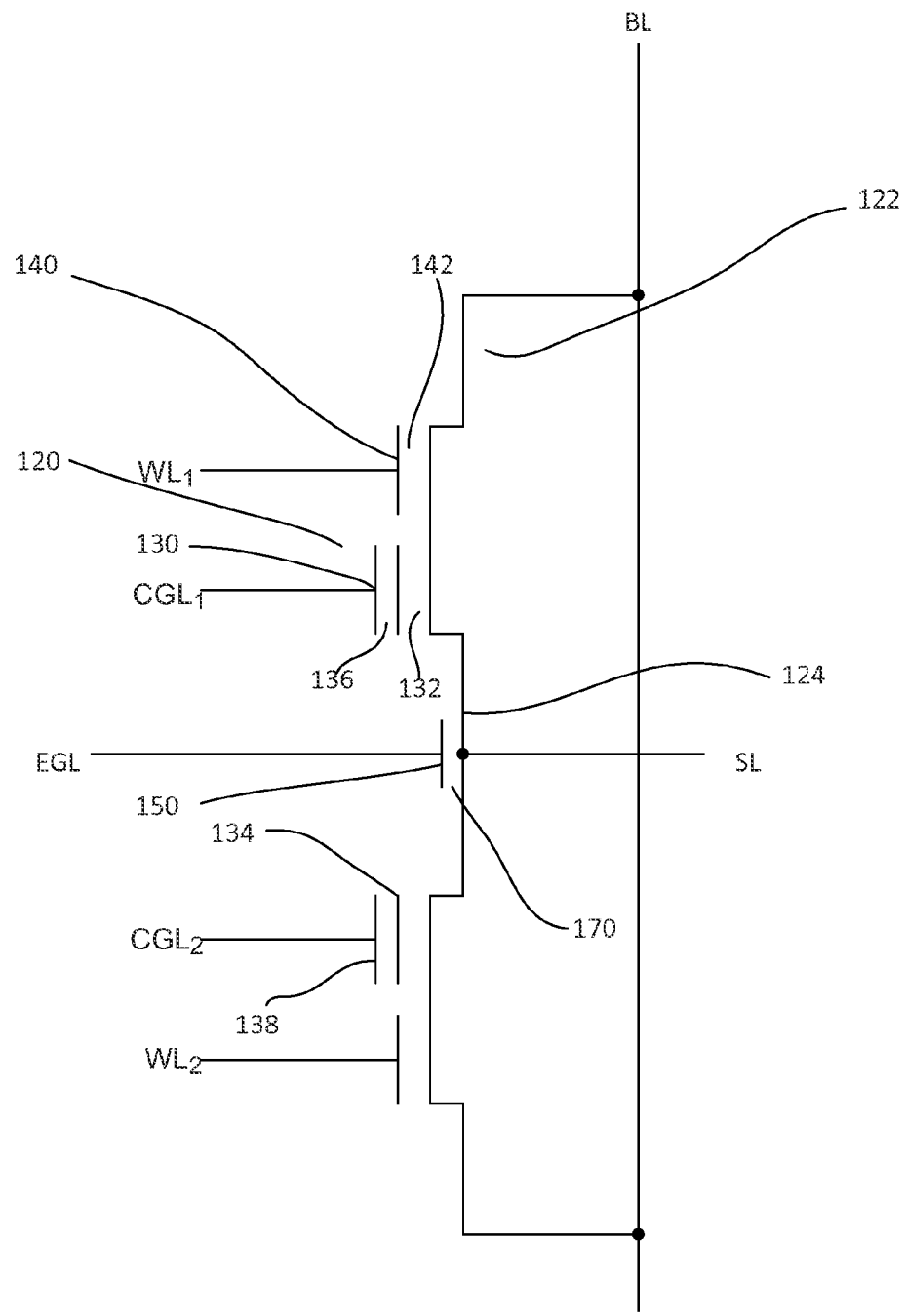
FIG. 1 shows schematic diagram of an embodiment of a device.

FIG. 1 shows a schematic diagram of an embodiment of a device with a memory cell pair 110. For example, the memory cell pair includes first and second memory cells. The memory cells, in one embodiment, are NVM cells. Providing other types of memory cells may also be useful.

A memory cell includes a cell transistor with a gate 120 between terminals 122 and 124. The gate, in one embodiment is a split gate. For example, the split gate includes primary and secondary gates 130 and 140. The primary gate may be referred to as a storage gate. The storage gate includes a control gate 138 and a floating gate 134. The floating gate is separated from a channel of the transistor by a floating gate dielectric 132 and the control gate is separated from the control gate by a storage gate dielectric 136. The control gate is coupled to a control gate line (CGL). As for the secondary gate, it serves as an access gate. For example, the secondary gate includes an access gate separated from the transistor channel by an access gate dielectric 142. The access gate is coupled to a wordline (WL).

The first terminal is coupled to a bitline (BL). As for the second terminal, it is coupled to a source line (SL). An erase gate (EG) 150 is provided over the second terminal. The erase gate is separated from the second terminal by a source line isolation dielectric 170. The erase gate is coupled to an erase gate line (EGL).

As illustrated, the memory cells of the pair share a common EGL and SL. For example, the second terminals of the first and second cell transistors form a common second terminal, with a common erase gate disposed over it. A first wordline ($WL_1$) is coupled to the access gate of the first cell transistor and a first control gate line ($CGL_1$) is coupled to the control gate of the first cell transistor; a second wordline ($WL_2$) is coupled to the access gate of the second cell transistor and a second control gate line ($CGL_2$) is coupled to the control gate of the second cell transistor. As for the first terminals of the cell transistors, they are coupled to a common bitline (BL). For example, the cells of the memory cell pair are part of the same column of memory cells. Memory cells may be interconnected by wordlines (WLs), control gate lines (CGLs), erase gate lines (EGLs), source lines (SLs) and bitlines (BLs) to form a memory array.

An array may be configured in sectors. For example, an array may include multiple sectors. Source lines of a sector may be commonly coupled. For example, second diffusion regions of a sector may be commonly coupled. Other suitable configurations of an array may also be useful.

Figure 2:
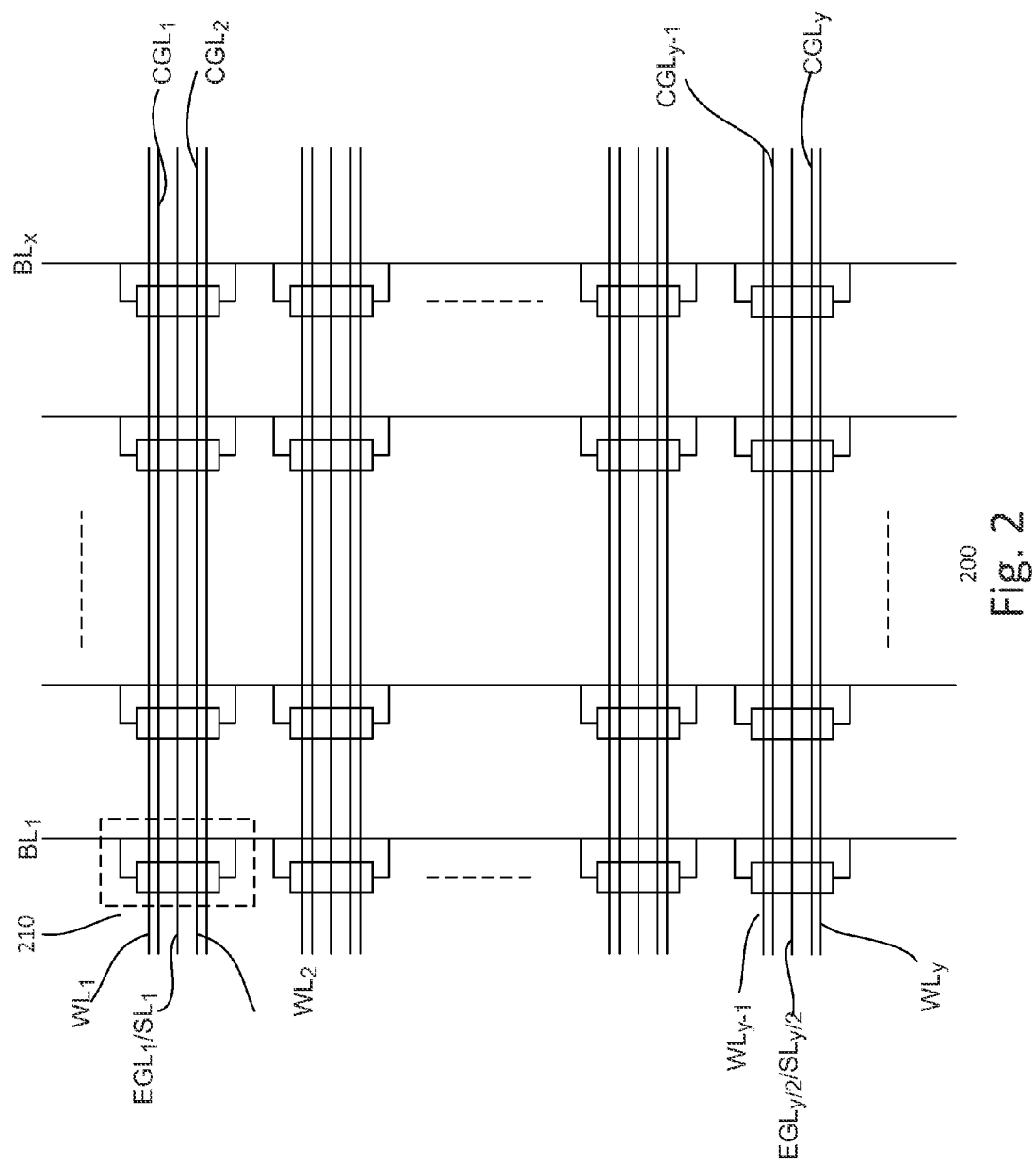
FIG. 2 shows an embodiment of a memory array.

FIG. 2 shows a plurality of memory cell pairs 210 configured to form a memory array 200. The plurality of memory cell pairs of the array are arranged in first and second directions. Memory cells are interconnected in the first direction by wordlines (WLs), control gate lines (CGLs), erase gate lines (EGLs), and source lines (SLs) to form rows of memory cells and in the second direction by bitlines (BLs) to form columns of memory cell. Other configurations of the lines may also be useful. As shown, the array includes y rows and x columns of memory cells. Since EGLs and SLs are common to a pair of memory cells, there are y/2 EGLs and SLs. Source lines of a memory sector may be commonly coupled. Other suitable configurations of the array may also be useful.

Appropriate voltages may be applied to a memory cell via the BL, CGL, WL, EGL and SL to perform different memory operations. The different memory operations may include program, read and erase operations. Table 1 below shows exemplary biasing conditions of the memory array for selected and non-selected cells for different operations.

be intermediately or heavily doped. Providing a doped well having other dopant concentrations may also be useful. The doped well may be a common doped well in the array region for the memory cells. In one embodiment, the array well is biased at an array well bias voltage ($V_{bias}$). In one embodiment, $V_{bias}$ about 0V. The second polarity type doped well serves as a well for a first polarity type device. In one embodiment, the second polarity type includes p-type. For example, the p-type doped well serves as a well for a n-type memory cell. Providing a n-type doped well may also be useful. P-type dopants can include boron (B), aluminum (Al), indium (In) or a combination thereof while n-type dopants can include phosphorus (P), arsenic (As), antimony (Sb) or a combination thereof.

The substrate includes isolation regions (not shown) to isolate active device regions from other active device regions, as required. The isolation regions, for example, are shallow trench isolation (STI) regions. Other types of isolation regions are also useful. For example, isolation regions may be used to isolate rows and columns of memory cells.

A memory cell includes a cell transistor with a gate 320 between first and second cell terminals or source/drain (S/D)

TABLE 1

| | Signal (V) | | | | | | | | | |
|---|---|---|---|---|---|---|---|---|---|---|
| | WL | | SL | | BL | | CGL | | EGL | |
| Operation | sel | Un-sel | sel | Un-sel | sel | Un-sel | sel | Un-sel | sel | unsel |
| Read | $V_{CC}$ | 0 | 0 | $V_{ref}$ | $V_{ref}$ | $V_{CC}$ | 0 | 0 | 0 | 0 |
| Program | $V_t < V < V_{CC}$ | 0 | 4.5 | 0 | <1 | $V_{CC}$ | 10 | 0 | 4.5 | 0 |
| Erase | 0 | 0 | 0 | 0 | 0 | 0 | 0 | 0 | 10-12 | 0 |

The biasing conditions are exemplary. The biasing, for example, is based on $V_{CC}$ which is equal to about 2.5 or 3.3V and $V_{ref}$ which is equal to about 0.8-1.0V. Other suitable biasing conditions may also be useful.

FIG. 3 shows a cross-sectional view of an embodiment of a device 300. The device includes a substrate 305. The substrate, for example, may be a silicon substrate. The substrate can be lightly doped with p-type dopants. Other types of semiconductor substrates may also be used. For example, the substrate may be silicon germanium or silicon-on-insulator (SOI) as well as intrinsic or doped with other types of dopants or dopant concentrations.

The substrate may be prepared with a memory region containing memory cells of the device. The memory region can be referred to as an array region. Providing a substrate prepared with other types of regions (not shown) may also be useful. For example, the substrate may include a logic region for support or other types of logic circuitry. The substrate may also include regions for other types of circuitry, depending on the type of device or IC. For example, the logic region may include sub-regions for high voltage (HV), medium voltage (MV) and low voltage (LV) devices.

As shown, the memory region includes a pair of memory cells 310. In one embodiment, the memory cells are NVM cells. Providing other types of memory cells may also be useful. The pair of memory cells, as shown, are from two adjacent rows. The cells of the memory cell pair are adjacent memory cells of a column of memory cells. It is understood that the cell region includes numerous memory cells arranged in columns and rows to form a memory array. The array may be configured to have sub-arrays or sectors.

The array region may include a doped well (not shown) with dopants of a second polarity type. The doped well may regions 322 and 324. The gate, in one embodiment, is a split gate. For example, the split gate includes primary and secondary gates 330 and 340. The gates, for example, are gate conductors extending the length of a row of memory cells. For example, the gates are common gates for a row of memory cells.

The primary gate, for example, is a storage gate. The storage gate includes a control gate 338 and a floating gate 334. The gates, for example, are polysilicon gates. The polysilicon gates may be doped polysilicon gates. For example, the polysilicon gates are doped with first polarity type dopants, such as n-type dopants. The gates are doped, for example, to reduce sheet resistance for performance, in the case of the control gate or to improve storage functions, in the case of the floating gate. The gates may be formed by, for example, chemical vapor deposition (CVD) and processed or patterned to the desired dimension or shape, such as an elongated straight gate conductor throughout its length or to include bended and/or expanded region, depending on the strap configurations as will be described later. For example, other suitable types of gates or forming techniques may also be useful. The floating gate is separated from the substrate by a floating gate dielectric 332 and the control gate is separated from the floating gate by a storage gate dielectric 336. The floating gate dielectric, in one embodiment, is a thermal oxide. As for the storage gate dielectric, it is an oxide/nitride/oxide (ONO) stack. The ONO stack may be formed by, for example, CVD. Other suitable types of floating gate or storage gate dielectrics as well as forming techniques may also be useful.

In one embodiment, the storage gate includes a hard mask layer 339. For example, the hard mask is disposed over the control gate. The hard mask, for example, may be silicon nitride. Other suitable types of hard mask materials may also be useful. For example, the hard mask may be silicon oxide. In some cases, the hard mask may be a hard mask stack having multiple dielectric layers. For example, the hard mask stack may be a nitride/oxide or nitride/oxide/nitride stack. The hard mask, for example, may be formed by CVD.

As for the secondary gate 340, it serves as an access gate or word line. The secondary gate is disposed adjacent to the storage gate and first cell terminal 322. The secondary gate includes an access gate separated from the substrate by an access gate dielectric 342. The access gate, for example, may be polysilicon. The polysilicon may be doped polysilicon. For example, the polysilicon may be doped with n-type dopants. Doping the polysilicon, for example, lowers sheet resistance. The access gate may be formed by CVD and processed or patterned to the desired dimension or shape, such as an elongated straight gate conductor throughout its length or to include bended and/or expanded region, depending on the strap configurations as will be described later. Other suitable types of access gates or forming techniques may also be useful. The access gate dielectric may be thermal oxide. For example, the access gate dielectric and floating gate dielectric may be formed of the same thermal oxide layer. Other suitable configurations of the access gate may also be useful. The storage gate and access gate may be gate conductors. For example, the gates form common gates for a row of memory cells.

The first and second source/drain (S/D) regions 322 and 324 are heavily doped first polarity type doped regions. For example, first polarity type doped S/D regions are for first polarity type cell transistors. In one embodiment, the first polarity type is n-type for a n-type cell transistor. The S/D regions may include lightly doped drain (LDD) regions. The S/D regions may also include halo regions, which are doped with second polarity type dopants. In one embodiment, the second S/D region 324 serves as a buried source line of the memory cell. The second S/D region, for example, extends the length of a row and is a common second S/D region for a row of memory cells.

An erase gate 350 is disposed over the second S/D region. The erase gate, for example, is a polysilicon gate formed by CVD. The erase gate, for example, is a polysilicon gate. The polysilicon may be doped polysilicon. The polysilicon may be doped with n-type dopants. Doping the polysilicon, for example, lowers sheet resistance. Other suitable types of gate materials or forming techniques may also be useful. The thickness of the erase gate may be about 1000 Å. Other suitable thicknesses may also be useful. The erase gate is isolated from the second S/D region by a source line isolation dielectric 370. The source line isolation dielectric, for example, is a thermal oxide layer. The erase gate and source line isolation dielectric, as formed, extend the length of a row of memory cells. The second S/D region, for example, serves as a buried SL for a row of cells.

Dielectric spacers 360 are provided on sidewalk of the gates. The spacers provide electrical separation from the gates and serve to facilitate forming LDD regions in the S/D regions. Halo regions may also be provided in the S/D regions. The spacers may be spacer stacks having multiple dielectric layers. In one embodiment, sidewalls of the storage gate are lined with oxide and nitride layers 362 and 364. The oxide layer may be a high temperature oxide (HTO) formed by CVD followed by an anneal while the nitride liner is formed by CVD. To form these spacers, the oxide and nitride layers may be formed and anisotropically etched, leaving spacers on the sidewalls. A HTO spacer 366 is disposed on the nitride spacer on the access gate side of the control gate and a HTO spacer 367 is disposed on the nitride spacer on the erase gate side of the control gate. The spacer 367 may be referred to as erase gate spacer. The dielectric spacers 360, for example, are ONO spacers. As for the spacer 369 on sidewall of the access gate adjacent to the first cell terminal and spacer 368 on sides of the control gate above the access gate and erase gate, it includes a low temperature oxide (LTO) and nitride. The spacers, for example, are formed using spacer techniques, such as anisotropically etching the layers to remove horizontal portions while vertical portions of the layers remain as the spacers. Other suitable configurations of or techniques for forming the spacers may also be useful.

The cell transistors of the memory cell pair share a common second S/D region. Likewise, the cell transistors of the memory cell pair share a common erase gate. The second S/D region serves as a common buried SL for memory cell pairs of two adjacent rows. Likewise, the erase gate serves as a common erase gate for memory cell pairs of two adjacent rows, isolated from the buried SL by the source line isolation dielectric.

The various connections to or terminals of the memory cells may be provided with metal silicide contacts, such as nickel silicide contacts. Other suitable types of metal silicide contacts may also be useful. For example, first S/D regions, buried SL, access gate, floating gate and erase gate are provided with metal silicide contacts. Providing metal silicide contacts reduces contact resistance to the terminals of the memory cell. To access the buried SL or second S/D region, a SL strap opening (not shown) may be created. The strap opening is created in the erase gate and the source line isolation dielectric to expose the buried SL. For example, metal silicide is formed for the various terminals of the memory cell after the strap opening is formed. Forming metal silicide contacts for the memory cells may also form metal silicide contacts for transistors of the other device regions, such as the HV and LV regions.

In one embodiment, the SL strap opening reduces or avoids overlapping into the control gate. For example, the SL strap opening in the Y direction reduces or avoids encroaching into the control gate. Reducing or avoiding encroaching into the control gate improves reliability of the device. For example, this reduces or avoids erosion of the control gate which can result in shorts between the SL and control gate, thus improving yields.

A dielectric layer 389 is disposed over the memory cell. The dielectric layer, for example, serves as a contact level of an interlevel dielectric (ILD) layer. For example, the dielectric layer serves as a first contact level of the first ILD level or layer. The first contact level may be referred to as a pre-metal dielectric (PMD) or CA level. Contacts (not shown) are formed to the various terminals of the memory cell. For example, the contacts may be formed in the CA level coupled to the first S/D region, CG, SL, EG and WL. The contacts, for example, are tungsten contacts. Other types of contacts are also useful. Conductive lines may be provided in a metal level of the ILD layer above the contact level. For example, conductive lines may be provided in the first metal level of the first ILD layer. Additional ILD layers with contact and metal levels are provided. For example, metal lines of the memory cell may be provided in more than one metal level. Metal lines in the same direction are provided in the same level. For example, WLs, EGLs, SLs and CGLs may be in the same level while BLs may be on another level. In some cases, SLs and EGLs may be disposed in different levels. Other suitable configurations of metal lines may also be useful.

An EGL is coupled to the erase gate and a SL is coupled to the second S/D region or buried SL. A first wordline WL$_1$ is coupled to the access gate of the first cell transistor and a first control gate line CGL$_1$ is coupled to the control gate of the first cell transistor; a second wordline WL$_2$ is coupled to the access gate of the second cell transistor and a second control gate line CGL$_2$ is coupled to the control gate of the second cell transistor. As for the first terminals of the cell transistors, they are coupled to a common bitline BL. For example, the cells of the memory cell pair are part of the same column of memory cells. Memory cells may be interconnected by WLs, CGLs, EGLs, SLs and BLs to form a memory array.

Lines disposed in the same direction may be provided in the same metal level. Different direction lines are provided in different metal levels. For example, in the case where CGLs, WLs, SLs and EGLs are disposed in a first direction, they may be disposed in the same metal level, such as the first metal level M1 while BLs which are disposed a second direction, may be provided in a different metal level, such as the second metal level M2. Other suitable configurations of conductive lines may also be useful.

Figure 4B:
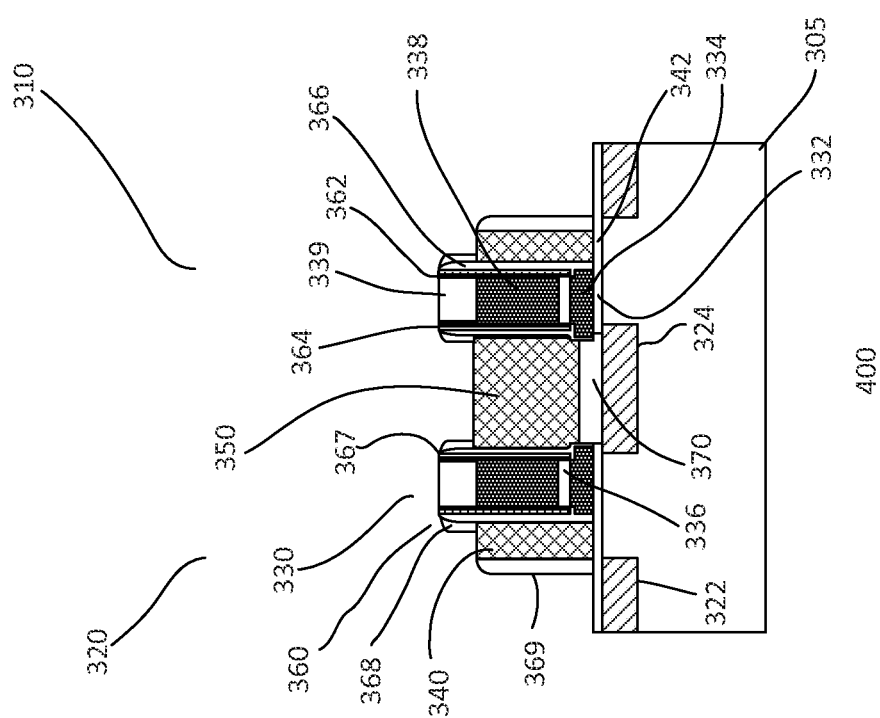
Figure 4C:
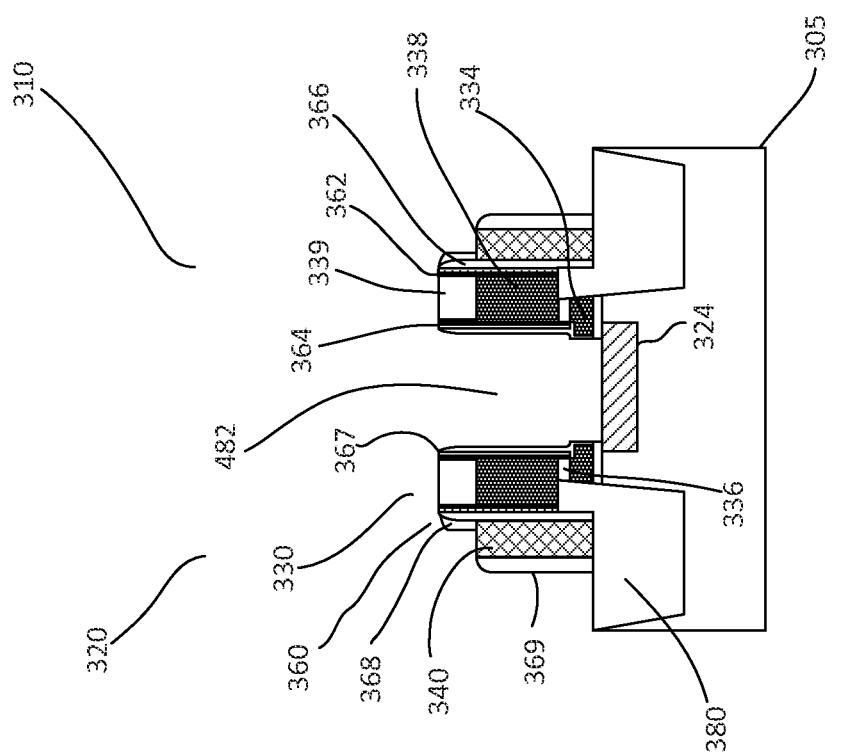

FIGS. 4a-4c show various simplified views of a device 400. FIG. 4a shows a top view of an embodiment of a layout of the device which includes a single strap configuration while FIGS. 4b-4c show cross-sectional views at A-A' and B-B'. In one embodiment, the single strap configuration as illustrated in the top view of FIG. 4a corresponds to a source line (SL) strap configuration. The device includes a substrate 305 with an array region 407. The device, for example, is similar to that described in FIGS. 1-3. Common elements may not be described or described in detail. As discussed, the device may include other device regions, such as logic regions, including HV, MV and LV regions (not shown). The various regions include device wells for respective devices. For example, array region includes an array well while HV regions include HV p wells for HV n-type devices and HV n wells for HV p-type devices and LV regions include LV p wells for LV n-type devices and LV n wells for LV p-type devices. The various regions may be isolated by isolation regions, such as STI regions 380.

The device shown is at an intermediate stage of processing. For example, the substrate has been partially processed to include partially formed memory cells 310. As shown, the substrate is processed at the stage of processing prior to back end of line (BEOL). In other words, the substrate is processed at the stage of processing prior to forming the first ILD level. For example, the device is processed to exclude the contact level dielectric of the first ILD level.

As shown in FIGS. 4a-4c, the substrate has been processed to include various components of the memory cells by front end of line (FEOL) processing. For example, wells, isolation regions 380, storage gates 330, access gates 340, buried SL 324, spacers 360 and 369, erase gate 350 and source line isolation dielectric 370 are formed. These various components of the memory cells are formed by suitable techniques and materials as described in FIG. 3. Also, as shown, hard mask 339 is provided above the control gates 338. Additionally, wells and gates of transistors in the logic regions, such as HV and LV regions (not shown) may be formed at this stage.

A SL strap opening 482, as shown in FIGS. 4a and 4c, is formed. The SL strap opening, for example, exposes the buried SL (or second S/D region) for subsequent silicidation. The SL strap opening, for example, may be formed between adjacent memory cell pairs. For example, SL strap openings are formed between adjacent memory cell pairs of adjacent rows along the row of memory cell pairs. It is understood that SL openings need not be provided between every adjacent cell pairs of adjacent rows. The number of SL strap openings may depend on, for example, performance requirements.

In one embodiment, the SL strap opening 482 includes first and second concentric SL strap openings 483 and 484. The second SL strap opening is disposed within the first SL strap opening. The SL strap openings are formed using separate mask and etch processes. For example, the first SL strap opening is formed using a first mask and etch process and the second SL opening is formed using a second mask and etch process.

A mask and etch process, for example, includes forming a photoresist layer and lithographically exposing it with an exposure source through a reticle having a mask pattern. After exposure, the photoresist layer is developed. This transfers the pattern of the reticle to the photoresist layer, forming a patterned resist mask. The patterned resist layer serves as an etch mask for an anisotropic etch, such as reactive ion etch (RIE) to transfer the pattern of the resist mask to underlying layers. An antireflective coating (ARC) may be provided beneath the photoresist layer to improve lithographic resolution.

A first mask and etch process forms the first SL strap opening. For example, a first photoresist mask is patterned to form a first SL strap opening to expose portions of the erase gate 350 to be removed. A first etch, such as a first RIE, removes the exposed portion of the erase gate selective to the source line isolation dielectric. For example, the etch removes polysilicon selective to oxide. This removes the exposed portion of the erase gate while the source line isolation dielectric 370 remains. The first patterned mask is removed thereafter, for example, by ashing.

A second mask and etch process forms the second SL strap opening. For example, a second photoresist mask is patterned to form a second SL strap opening which exposes a portion of the source line isolation dielectric 370 to be removed. The second SL strap opening is disposed within the first SL strap opening. A second etch, such as RIE, removes the exposed portions of the source line isolation dielectric selective to the substrate. For example, the etch removes oxide selective to silicon. This removes the source line isolation dielectric to expose the buried SL 324 below. The second patterned mask is removed thereafter, for example, by ashing.

The SL opening formed leaves an oxide border surrounding the buried SL. The oxide border displaces the erase gate from the buried SL. The displacement should be sufficient to ensure no shorting occurs between the subsequently formed silicided SL and strap contact 391 (shown with dotted line) and erase gate. In addition, the erase gate spacer lines the buried SL, improving isolation between the erase gate and SL.

In one embodiment, the first SL strap opening reduces or avoids overlapping into the control gate. For example, the first SL strap opening in the Y direction reduces or avoids encroaching into the control gate. Reducing or avoiding encroaching into the control gate improves reliability of the device. For example, this reduces or avoids erosion of control gate which can result in shorts between the SL and control gate, thus improving yields.

After forming the strap openings, the process continues to complete formation of the memory cells and other devices. For example, one of the processes includes performing a metal silicide process. The metal silicide process, for example, is a nickel silicide process. Other suitable types of silicide processes may also be performed. The silicide process forms metal silicide contacts in exposed portions of silicon surface, including substrate and silicon gates. For example, metal silicide contacts, such as nickel silicide contacts, are formed on the various connections to the memory cells. For example, metal silicide contacts may be formed on the first S/D regions, buried SL, access gate, floating gate and erase gate. Metal silicide contacts are also formed for connections of transistors of the other device regions, such as the HV and LV regions. For example, metal silicide contacts may be formed in S/D regions and gates of transistors in the logic regions or other device regions.

After forming silicide contacts, BEOL process may commence. For example, a dielectric layer may be formed on the substrate covering the transistors and memory cells. The dielectric layer, for example, serves as a pre-metal dielectric (PMD) layer in which contacts to contact regions of the memory cells and logic transistors are formed. A metal level may be formed over the PMD layer. Metal interconnects may be formed in the metal level. The metal level may serve as a first metal level, such as M1. Additional ILD levels may be formed to provide interconnects to the components of the device. The process continues to complete forming the device.

As described, the SL strap opening does not overlap into the CG. We have discovered that erosion of CG occurs in conventional processes despite the presence of a hard mask over the CG. By avoiding the overlap of the SL strap opening into the CG, the erosion of the control gate is prevented. This results in improved reliability and yield.

Figure 5:
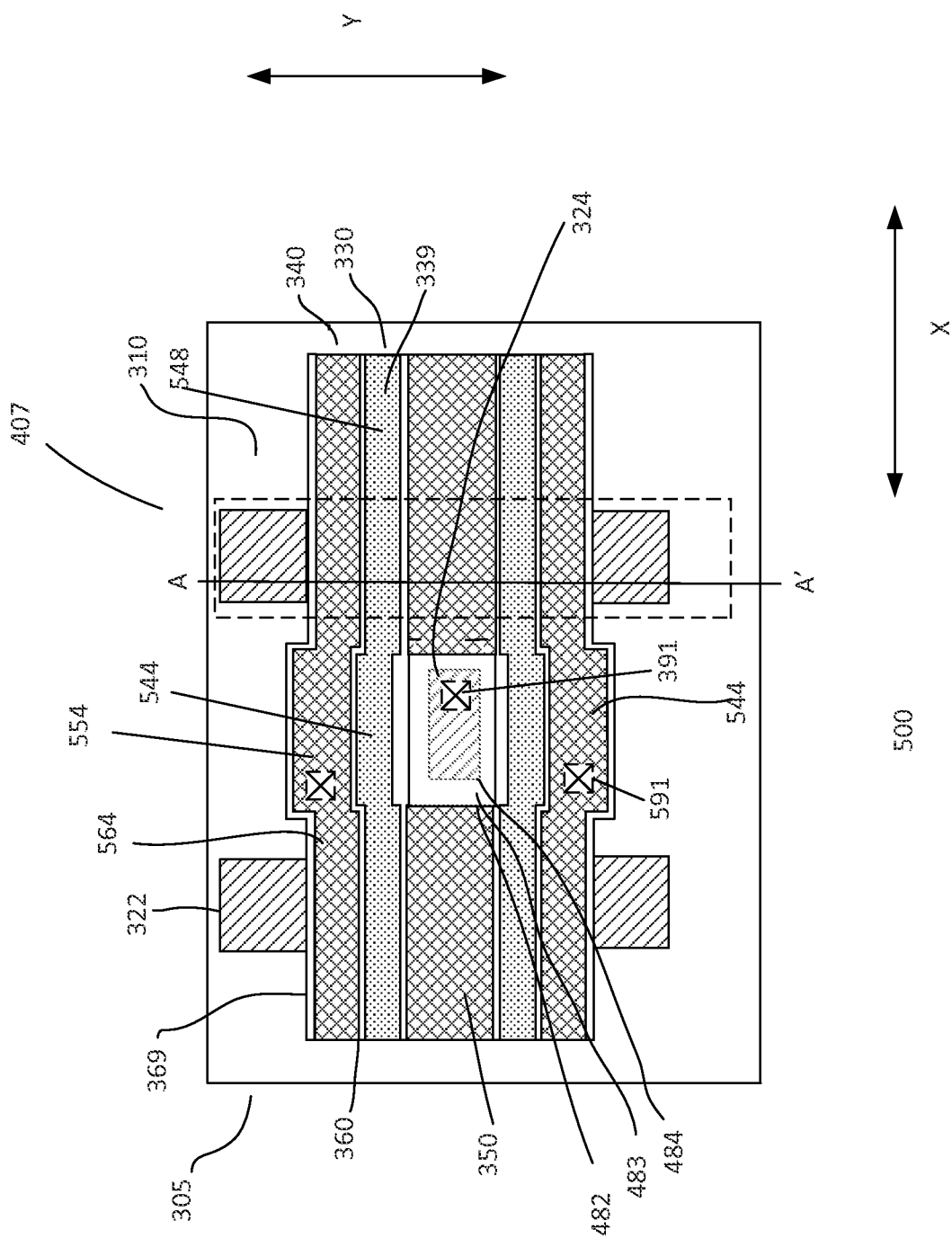
FIG. 5 shows a top view of another embodiment of a layout of the device.

FIG. 5 shows a top view of another embodiment of a layout of the device 500 which includes multiple straps configuration. In one embodiment, the multiple straps configuration as illustrated in the top view of FIG. 5 corresponds to word line (WL)/source line (SL) straps configuration. The layout of FIG. 5 and the cross-sectional view along A-A', for example, are similar to that described in FIGS. 1-3 and FIGS. 4a-4b. Common elements may not be described or described in detail. In the interest of brevity, the description of below primarily focuses on the difference(s) between the layout shown in FIG. 4a and layout shown in FIG. 5.

As described, the layout of FIG. 5 corresponds to WL/SL straps configuration. In this embodiment, WL contacts and SL contacts may be formed in the same region of the memory array region. The layout of FIG. 5 also includes the SL strap opening 482 as described in FIGS. 4a-4c above. In one embodiment, the CG of the primary gate 330 may be processed to include a bended region 544 adjacent to the SL strap opening 482 as shown in FIG. 5. This differs from the CG of the primary gate as shown in FIG. 4a of which the CG is processed as an elongated straight gate conductor throughout its length. In one embodiment, the bended region includes a length in the x-direction which is slightly larger than the SL strap opening and includes a height in the y-direction that is slightly higher than the height of the regions of the CG 548 which are away from the SL strap opening. The bended region of 544, as shown in FIG. 5, increases the process window for forming the SL strap opening.

In addition, the secondary gate conductor 340 as shown in FIG. 5 is processed to also include a bended and expanded 554 region adjacent to the SL strap opening. The bended and expanded region of the secondary gate 554 as shown in FIG. 5 includes a width which is larger than the width of the regions of the secondary gate 564 which are away from the SL strap opening. This differs from the secondary gate conductor 340 in FIG. 4a of which the secondary gate is processed as an elongated straight gate conductor having the same width throughout its length. The bended and expanded region of the secondary gate, as shown in FIG. 5, increases the process window for forming the WL strap contact 591 (shown with dotted line) later.

Figure 6B:
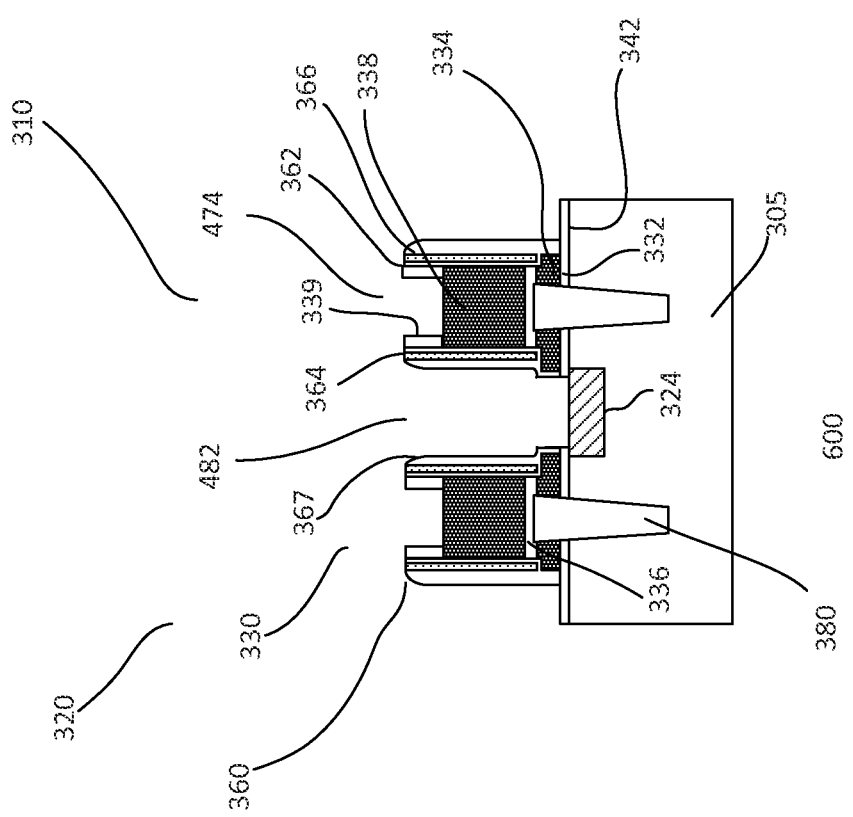

FIGS. 6a-6b shows various view of a device 600. FIG. 6a shows a top view of another embodiment of a layout of the device which includes multiple straps configuration. In one embodiment, the multiple straps configuration as illustrated in the top view of FIG. 6a corresponds to a control gate (CG)/source line (SL) strap configuration. The layout of FIG. 6a and the cross-sectional view along C-C' as shown in FIG. 6b, for example, are similar to that described in FIGS. 1-3 and FIGS. 4a and 4c. Common elements may not be described or described in detail, in the interest of brevity, the description of below primarily focuses on the difference(s) between the layout of shown in FIG. 4a and layout shown in FIG. 6a.

As described, the layout of FIG. 6a corresponds to CG/SL straps configuration. In this embodiment, CG contacts and SL contacts may be formed in the same region of the memory array region. The layout of FIG. 6 also includes the SL strap opening 482 as described in FIGS. 4a-4c above. In one embodiment, in addition to the SL strap opening 482, the layout as shown in FIG. 6a also includes a CG strap opening 474 which exposes, for example, the CG 338 for subsequent silicidation. The CG strap opening may be formed over each CG of the memory cell pair.

In one embodiment, the CG of the primary gate 330 may be processed to include an expanded region 644 adjacent to the SL strap opening as shown in FIG. 6a. This differs from the CG of the primary gate as shown in FIG. 4a of which the CG is processed as an elongated straight gate conductor throughout its length. In one embodiment, the expanded region of the CG includes a width which is wider in the y direction than the width of the CG regions 654 away from the SL strap opening. The expanded region of the CG, as shown in FIGS. 6a and 6b, increases the process window fir forming the CG strap contact 691 (shown with dotted line) later.

As described in FIGS. 4a-4c above, a first mask and etch process forms the first SL strap opening. For example, a first photoresist mask is patterned to form a first SL strap opening to expose portions of the erase gate 350 to be removed. A first etch, such as a first RIE, removes the exposed portion of the erase gate selective to the source line isolation dielectric. For example, the etch removes polysilicon selective to oxide. This removes the exposed portion of the erase gate while leaving the source line isolation dielectric 370. In one embodiment, the first mask and etch process also form breaks 444 in the secondary gate or WL. The WL breaks are disposed adjacent to here CG strap openings 474 are formed. The first patterned mask is removed thereafter, for example, by ashing.

The process continues by performing second mask and etch process to form the second SL strap opening. For example, a second photoresist mask is patterned to form a second SL strap opening which exposes a portion of the source line isolation dielectric 370 to be removed. The second SL strap opening is disposed within the first SL strap opening. A second etch, such as a second RIE, removes the exposed portions of the source line isolation dielectric selective to the substrate. For example, the etch removes oxide selective to silicon. This removes the source line isolation dielectric to expose the buried SL 324 below.

The second mask and etch process also forms CG strap openings 474, as shown in FIGS. 6a and 6b. The second patterned mask exposes the hard mask 339 over the CG. The second etch removes the exposed portions of the hard mask, exposing the CG 338 below. The CG opening may leave hard mask spacers on sides of the control gate spacers. The second patterned mask is removed after forming the second SL and CG strap openings, for example, by ashing.

After forming the strap openings, the process continues to complete the formation of the memory cells and other devices. One of these processes includes performing a metal silicide process. The metal silicide process, for example, is a nickel silicide process. Other suitable types of silicide processes may also be performed. The silicide process forms metal silicide contacts in exposed portions of silicon surface, including substrate and silicon gates. For example, metal silicide contacts, such as nickel silicide contacts, are formed on the various connections to the memory cells. For example, metal silicide contacts are formed on the first S/D regions, buried SL, access gate, floating gate and erase gate. Metal silicide contacts are also formed for connections of transistors of the other device regions, such as the HV and LV regions. For example, metal silicide contacts are formed in S/D regions and gates of transistors in the logic regions or other device regions.

After forming silicide contacts, BEOL process may commence. For example, a dielectric layer may be formed on the substrate covering the transistors and memory cells. The dielectric layer, for example, serves as a pre-metal dielectric (PMD) layer in which contacts to contact regions of the memory cells and logic transistors are formed. A metal level may be formed over the PMD layer. Metal interconnects may be formed in the metal level. The metal level may serve as a first metal level, such as M1. Additional ILD levels may be formed to provide interconnects to the components of the device. The process continues to complete forming the device.

This disclosure may be embodied in other specific forms without departing from the spirit or essential characteristics thereof. The foregoing embodiments, therefore, are to be considered in all respects illustrative rather than limiting the invention described herein Scope of the invention is thus indicated by the appended claims, rather than by the foregoing description, and all changes that come within the meaning and range of equivalency of the claims are intended to be embraced therein.

What is claimed is:

1. A method for forming a device comprising:
providing a substrate having a memory array region;
performing front end of line (FEOL) processing, wherein
the FEOL processing forms a row of memory cell pairs having a plurality of memory cell pairs, each of the memory cell pairs includes first and second memory cells, wherein each of the memory cells includes
an access gate and a storage gate adjacent to the access gate, wherein the access gate and storage gate are gate conductors which extend a length of the row of memory cell pairs to serve as common access and storage gates for the memory cells of the row of memory cell pairs,
an erase gate disposed adjacent to the storage gate and between the first and second memory cells, wherein the erase gate is a common erase gate of the first and second memory cells, the erase gate is a gate conductor which extends the length of the row of memory cell pairs to serve as a common erase gate for the memory cells of the row of memory cell pairs,
first and second source/drain (S/D) regions disposed within the substrate, the first S/D region is adjacent to the access gate, the second S/D region is adjacent to the storage gate and underlaps the erase gate, wherein the second S/D region is a common second S/D region of the first and second memory cells,
a source line isolation dielectric disposed on the substrate and between the first and second memory cells, wherein the source line isolation dielectric extends the length of the row of memory cell pairs and separates the erase gate from the second S/D region, the source line isolation dielectric is a common source line isolation dielectric of the memory cells of the row of memory cell pairs,
an array isolation region in the memory array region, the array isolation region isolates the memory cells of the row of memory cell pairs, wherein the array isolation region does not extend to isolate the second S/D region of each memory cell pair, and
wherein the second S/D region extends the length of the row of memory cell pairs and serves as a common second S/D region for the memory cells of the row of memory cell pairs;
forming a source line (SL) strap opening within a portion of the erase gate to expose a portion of the common second S/D region of the row of memory cell pairs, wherein
forming the source line strap opening comprises forming a first concentric SL strap opening and forming a second concentric SL strap opening within the first concentric SL strap opening, and
the source line strap opening is formed between a first memory cell pair and a second memory cell pair of the row of memory cell pairs, wherein the source line strap opening does not overlap the storage gates of the memory cells; and
performing back-end-of-line (BEOL) processing, wherein the BEOL processing couples a source line to the common second S/D region of the row of memory cell pairs, wherein the second S/D region serves as a common buried source line for the row of memory cell pairs.

2. The method of claim 1 wherein each of the storage gates comprises a control gate over a floating gate and a hard mask is formed over the control gate, wherein the control gate and floating gate are gate conductors which extend the length of the row of memory cell pairs.

3. The method of claim 1 wherein the SL strap opening exposes the common second S/D region for silicidation process.

4. The method of claim 1 comprising performing a first mask and etch process to form the first concentric SL strap opening.

5. The method of claim 4 wherein the first mask and etch process removes a portion of the erase gate and exposes a top portion of the common source line isolation dielectric without exposing the common second S/D region of the row of memory cell pairs.

6. The method of claim 4 comprising performing a second mask and etch process to form the second concentric SL strap opening.

7. The method of claim 6 wherein the second mask and etch process removes a portion of the exposed common source line isolation dielectric and exposes a top portion of the common second S/D region of the row of memory cell pairs.

8. The method of claim 7 comprising performing a metal silicidation process to form a metal silicide contact on the exposed top portion of the common second S/D region.

9. The method of claim 2 wherein each of the control gates includes a bended and expanded region adjacent to the SL strap opening.

10. The method of claim 9 wherein each of the access gates includes a bended region adjacent to the bended and expanded region of the control gates.

11. The method of claim 2 wherein each of the control gates includes a same width throughout its length.

12. The method of claim 2 wherein each of the control gates includes different widths throughout its length.

13. A method for forming a device comprising:
providing a substrate having a memory array region;
performing front end of line (FEOL) processing, wherein the FEOL processing forms a row of memory pairs having a plurality of memory cell pairs, each of the memory cell pairs includes first and second memory cells, wherein each of the memory cells includes
a cell transistor having a split gate, wherein the split gate comprises an access gate and a storage gate adjacent to the access gate, wherein the storage gate is a gate conductor which extends a length of the row of memory cell pairs to serve as common storage gate for the memory cells of the row of memory cell pairs, the storage gate comprises a control gate over a floating gate, wherein the control gate is a gate conductor which extends the length of the row of memory cell pairs and the control gate includes different widths throughout its length,
an erase gate disposed adjacent to the split gate and between the first and second memory cells, wherein the erase gate is a common erase gate of the first and second memory cells, the erase gate is a gate conductor which extends the length of the row of memory cell pairs to serve as a common erase gate for the memory cells of the row of memory cell pairs,
first and second source/drain (S/D) regions disposed within the substrate, the first S/D region is adjacent to a first side of the split gate, the second S/D region is adjacent to a second side of the split gate and underlaps the erase gate, wherein the second S/D region is a common second S/D region of the first and second memory cells,
an array isolation region in the memory array region, the array isolation region isolates the memory cells of the row of memory cell pairs, and
wherein the second S/D region extends the length of the row of memory cell pairs and serves as a common second S/D region for the memory cells of the row of memory cell pairs;
forming a source line (SL) strap opening within a portion of the erase gate to expose a portion of the common second S/D region of the row of memory cell pairs, wherein the source line strap opening is formed between a first memory cell pair and a second memory cell pair of the row of memory cell pairs; and
forming a metal silicide contact on the exposed portion of the common second S/D region.

14. The method of claim 13 comprising performing back-end-of-line (BEOL) processing, wherein the BEOL processing couples a source line to the common second S/D region of the row of memory cell pairs, wherein the second S/D region serves as a common buried source line for the memory cells of the row of memory cell pairs.

15. The method of claim 13 comprising forming a hard mask disposed on the gate conductor of each control gate of the row of memory cell pairs, wherein the hard mask extends along the length of the row of memory cell pairs.

16. The method of claim 15 wherein the gate conductor of each control gate of the row of memory cell pairs comprises an expanded region adjacent to the SL strap opening.

17. The method of claim 16 comprising forming a control gate (CG) strap opening within a portion of the hard mask, wherein the CG strap opening exposes a top portion of the expanded region of the control gate.

18. The method of claim 13 wherein forming the source line strap opening comprises forming a first concentric SL strap opening and forming a second concentric SL strap opening within the first concentric SL strap opening.

19. A method for forming a device comprising:
providing a substrate having a memory array region;
performing front end of line (FEOL) processing, wherein the FEOL processing forms a row of memory cell pairs having a plurality of memory cell pairs, each of the memory cell pairs includes first and second memory cells, wherein each of the memory cells includes
an access gate and a storage gate adjacent to the access gate, wherein the storage gate extends a length of the row of memory cell pairs to serve as a common storage gate for the memory cells of the row of memory cell pairs,
an erase gate disposed adjacent to the storage gate and between the first and second memory cells, wherein the erase gate is a common erase gate of the first and second memory cells, wherein the erase gate extends the length of the row of memory cell pairs to serve as a common erase gate for the memory cells of the row of memory cell pairs,
first and second source/drain (S/D) regions disposed within the substrate, the first S/D region is adjacent to the access gate, the second S/D region is adjacent to the storage gate and underlaps the erase gate, wherein the second S/D region is a common second S/D region of the first and second memory cells, wherein the second S/D region extends the length of the row of memory cell pairs and serves as a common second S/D region for the memory cells of the row of memory cell pairs, and
a source line isolation dielectric disposed on the substrate and between the first and second memory cells, wherein the source line isolation dielectric extends the length of the row of memory cell pairs and separates the erase gate from the second S/D region, the source line isolation dielectric is a common source line isolation dielectric of the memory cells of the row of memory cell pairs; and
forming a source line (SL) strap opening to expose a portion of the common second S/D region of the row of memory cell pairs, wherein forming the SL strap opening comprises
forming a first concentric SL strap opening within a portion of the erase gate to expose a top portion of the source line isolation dielectric, wherein the first concentric SL strap opening does not overlap the storage gates of the memory cells, and
forming a second concentric SL strap opening within the exposed top portion of the source line isolation dielectric to expose the portion of the common second S/D region.

20. The method of claim 19 comprising performing back-end-of-line (BEOL) processing, wherein the BEOL processing couples a source line to the common second S/D region of the row of memory cell pairs, wherein the second S/D region serves as a common buried source line for the memory cells of the row of memory cell pairs.

* * * * *